(12) United States Patent
Lee et al.

(10) Patent No.: US 7,524,722 B2
(45) Date of Patent: Apr. 28, 2009

(54) RESISTANCE TYPE MEMORY DEVICE AND FABRICATING METHOD AND OPERATING METHOD THEREOF

(75) Inventors: Ming-Daou Lee, Hsinchu (TW); Chia-Hua Ho, Hsinchu (TW); Erh-Kun Lai, Hsinchu (TW); Kuang-Yeu Hsieh, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 11/695,780

(22) Filed: Apr. 3, 2007

(65) Prior Publication Data

US 2008/0089111 A1    Apr. 17, 2008

(30) Foreign Application Priority Data

Oct. 12, 2006   (TW) .............................. 95137507 A

(51) Int. Cl.
*H01L 21/8234* (2006.01)
*H01L 21/8244* (2006.01)

(52) U.S. Cl. .................. 438/238; 438/381; 438/785; 257/E21.17; 257/E21.06; 257/E21.304; 257/E21.645

(58) Field of Classification Search ................. 438/238, 438/381, 278, 513, 680, 692, 785
See application file for complete search history.

(56) References Cited

U.S. PATENT DOCUMENTS

| 5,534,711 | A | * | 7/1996 | Ovshinsky et al. | ............. 257/3 |
| 7,084,691 | B2 | | 8/2006 | Hsu | |
| 2003/0001178 | A1 | * | 1/2003 | Hsu et al. | ............. 257/296 |

FOREIGN PATENT DOCUMENTS

CN          1574363        2/2005
WO     WO2005024839 A1    3/2005

* cited by examiner

*Primary Examiner*—David Nhu
(74) *Attorney, Agent, or Firm*—J.C. Patents

(57) ABSTRACT

A resistance type memory device is provided. The resistance type memory device is disposed on a substrate and includes a tungsten electrode, an upper electrode, and a tungsten oxide layer. The upper electrode is disposed on the tungsten electrode. The tungsten oxide layer is sandwiched between the tungsten electrode and the upper electrode.

27 Claims, 7 Drawing Sheets

RESISTANCE TYPE MEMORY DEVICE AND FABRICATING METHOD AND OPERATING METHOD THEREOF

CROSS-REFERENCE TO RELATED APPLICATION

This application claims the priority benefit of Taiwan application serial no. 95137507, filed Oct. 12, 2006. All disclosure of the Taiwan application is incorporated herein by reference.

BACKGROUND OF THE INVENTION

1. Field of the Invention

The present invention relates to a memory device and a fabricating method and an operating method thereof, and more particularly, to a resistance type memory device and a fabricating method and an operating method thereof.

2. Description of Related Art

Along with the development of the communication technology and the popularity of the Internet, the demands initiated by the public for the communication and processing of the information especially on the audio-video data transmission of great capacity and quick transmission speed are growing. On the other aspect, under the global competition, the work environment is not limited to the office but anywhere in the world at any time, and a great deal of information is needed to support this action and decision. Therefore, the requirements for portable digital apparatuses including the mobile platforms such as a digital notebook computer/NB, a personal digital assistant/PDA, an electronic book/e-book, a mobile phone, and a digital still camera/DSC are increasing significantly. Correspondingly, the requirements for accessing the above digital products through the storage apparatuses are greatly enhanced as well.

Since 1990, the semiconductor storage-based memory is developed, which now becomes a new technology of the storage medium. In order to satisfy the increasing requirements for memories along with the storage or transmission of a great deal of data, developing a new type of the memory device is of great importance and value.

SUMMARY OF THE INVENTION

In view of the foregoing, the present invention is firstly directed to a resistance type memory device, which can be applied to volatile and non-volatile memories.

The present invention is further directed to a method for fabricating a resistance type memory device, which can be integrated into the current manufacturing process.

The present invention is further directed to a method for operating a resistance type memory which can implement a multiple-bit storage operation at a storage point.

The present invention is further directed to a method for operating a resistance type memory device which can perform a plurality of programming operations repeatedly.

The present invention is further directed to a method for operating a resistance type memory device which can significantly increase a programming speed.

The present invention provides a resistance type memory device which is disposed on a substrate and includes a tungsten electrode, an upper electrode, and a tungsten oxide layer. The upper electrode is disposed on the tungsten electrode. The tungsten oxide layer is sandwiched between the tungsten electrode and the upper electrode.

According to the resistance type memory device disclosed in an embodiment of the present invention, the upper electrode comprises a semiconductor material, a metal material, or a metal barrier layer.

According to the resistance type memory device disclosed in an embodiment of the present invention, the substrate includes a silicon substrate.

The present invention also provides a method for fabricating a resistance type memory device. First, a substrate is provided. A tungsten electrode is then formed on the substrate. Next, a tungsten oxide layer is formed on the tungsten electrode, and an upper electrode is formed on the tungsten oxide layer.

According to the method for fabricating the resistance type memory device disclosed in an embodiment of the present invention, the method for forming the tungsten electrode includes forming a dielectric layer on the substrate, and an opening has been formed in the dielectric layer. Then, the tungsten electrode is formed on the dielectric layer and fills the opening. Next, the tungsten electrode outside the opening is removed.

According to the method for fabricating the resistance type memory device disclosed in an embodiment of the present invention, the method of forming the tungsten electrode includes performing a chemical vapor deposition (CVD) process.

According to the method for fabricating the resistance type memory device disclosed in an embodiment of the present invention, the method of removing the tungsten electrode outside the opening includes performing a chemical mechanical polishing (CMP) process.

According to the method for fabricating the resistance type memory device disclosed in an embodiment of the present invention, a thickness of the dielectric layer ranges from 100 nm to 1000 nm.

According to the method for fabricating the resistance type memory device disclosed in an embodiment of the present invention, the method of forming the tungsten oxide layer includes performing a plasma oxidation process.

According to the method for fabricating the resistance type memory device disclosed in an embodiment of the present invention, the method of forming the upper electrode includes performing the CVD process or a physical vapor deposition process.

The present invention provides a method for operating a resistance type memory including a plurality of resistance type memory devices. Each of the resistance type memory devices is disposed on a substrate and comprises a tungsten electrode, an upper electrode disposed on the tungsten electrode, and a tungsten oxide layer sandwiched between the tungsten electrode and the upper electrode. The operating method includes applying a pulse voltage to each of the tungsten oxide layers so as to adjust the resistivity thereof. Each of the resistivities represents a first resistivity when no pulse voltage is applied to any of the tungsten oxide layers, and each of the resistance type memory devices is in a first storage state. When each of the resistivities is adjusted to be a second resistivity, each of the resistance type memory devices is programmed to be in a second storage state. When each of the resistivities is adjusted to a third resistivity, each of the resistance type memory devices is programmed to be in a third storage state. When each of the resistivities is adjusted to be a fourth resistivity, each of the resistance type memory devices is programmed to be in a fourth storage state. Here, the second resistivity is greater than the first resistivity, the first resistivity is greater than the third resistivity, and the third resistivity is greater than the fourth resistivity.

According to the method for operating the resistance type memory device disclosed in an embodiment of the present invention, the first resistivity ranges from 0.4 ohms-cm to 5.7 ohms-cm, the second resistivity exceeds 5.7 ohms-cm, the third resistivity ranges from 0.07 ohms-cm to 0.4 ohms-cm, and the fourth resistivity is less than 0.07 ohms-cm.

According to the method for operating the resistance type memory disclosed in an embodiment of the present invention, the method of adjusting each of the resistivities includes manipulating a pulse-applied number of the pulse voltage.

According to the method for operating the resistance type memory disclosed in an embodiment of the present invention, the method of manipulating a pulse-applied number of the pulse voltage includes keeping each of the resistance type memory devices in the first storage state when no pulse voltage is applied to any of the tungsten oxide layers. When the pulse-applied number is less than a first critical number, each of the resistance type memory devices is programmed to be in the second storage state. When the pulse-applied number ranges from the first critical number to a second critical number, each of the resistance type memory devices is programmed to be in the third storage state. When the pulse-applied number is more than the second critical number, each of the resistance type memory devices is programmed to be in the fourth storage state. Here, the second critical number is greater than the first critical number.

According to the method for operating the resistance type memory disclosed in an embodiment of the present invention, the pulse-applied number of the pulse voltage is simultaneously or independently manipulated.

According to the method for operating the resistance type memory disclosed in an embodiment of the present invention, the method of simultaneously manipulating the pulse-applied number includes choosing the resistance type memory devices with predetermined ending states in the first storage state, the second storage state, the third storage state, and the fourth storage state. Next, a first pulse-applied number of the pulse voltage is applied to each of the resistance type memory devices other than to the resistance type memory devices with predetermined ending states in the first storage state. The first pulse-applied number is less than the first critical number. And, aside from the resistance type memory devices with predetermined ending states in the first storage state, each of the resistance type memory devices is programmed from the first storage state to the second storage state. Thereafter, a second pulse-applied number of the pulse voltage is applied to each of the resistance type memory devices other than to the resistance type memory devices with predetermined ending states in the first and the second storage states. The total of the first and the second pulse-applied numbers ranges from the first critical number to the second critical number. And aside from the resistance type memory devices with predetermined ending states in the first and the second storage states, each of the resistance type memory devices is programmed from the second storage state to the third storage state. Then, a third pulse-applied number of the pulse voltage is applied to each of the memory devices other than to the memory devices with predetermined ending states in the first, the second, and the third storage states. The total of the first, the second, and the third pulse-applied numbers is greater than the second critical number. And, aside from the memory devices with predetermined ending states in the first, the second, and the third storage states, each of the memory devices is programmed from the third storage state to the fourth storage state.

According to the method for operating the resistance type memory disclosed in an embodiment of the present invention, the method of independently manipulating the pulse-applied number includes choosing the resistance type memory devices with predetermined ending states in the first storage state, the second storage state, the third storage state, and the fourth storage state. Then, a fourth pulse-applied number is applied to each of the resistance type memory devices which is with predetermined ending states in the second storage state. The fourth pulse-applied number is less than the first critical number. Next, a fifth pulse-applied number is applied to each of the resistance type memory devices which is with predetermined ending states in the third storage state. The fifth pulse-applied number ranges from the first critical number to the second critical number. Thereafter, a sixth pulse-applied number is applied to each of the resistance type memory devices which is with predetermined ending states in the fourth storage state. The sixth pulse-applied number is greater than the second critical number.

According to the method for operating the resistance type memory disclosed in an embodiment of the present invention, the method of adjusting each of the resistivities includes manipulating a pulse-applied time of the pulse voltage.

The present invention provides a method for operating a resistance type memory device which is disposed on a substrate and includes a tungsten electrode, an upper electrode disposed on the tungsten electrode, and a tungsten oxide layer disposed between the tungsten electrode and the upper electrode. The method for operating the resistance type memory device includes applying a first positive pulse voltage to the resistance type memory device in an initial state at first, so as to program the same to be in a first storage state. Then, as the resistance type memory device is in the first storage state, a second negative pulse voltage is applied to the resistance type memory device so as to program the same to be in a second storage state. Next, as the resistance type memory device is in the second storage state, a third negative pulse voltage is applied to the resistance type memory device so as to program the same to be in a third storage state. Thereafter, as the resistance type memory device is in the third storage state, a fourth negative pulse voltage is applied to the resistance type memory device so as to program the same to be in a fourth storage state. Afterwards, as the resistance type memory device is in the fourth storage state, the first positive pulse voltage is applied to the resistance type memory device so as to program the same to be in the first storage state. Here, an absolute value of the second negative pulse voltage is less than that of the third negative pulse voltage, and the absolute value of the third negative pulse voltage is less than that of the fourth negative pulse voltage.

According to the method for operating the resistance type memory device disclosed in an embodiment of the present invention, the resistivity of the resistance type memory device in an initial state is a fifth resistivity, the resistivity of the resistance type memory device in the first storage state is a sixth resistivity, the resistivity of the resistance type memory device in the second storage state is a seventh resistivity, the resistivity of the resistance type memory device in the third storage state is an eighth resistivity, and the resistivity of the resistance type memory device in the fourth storage state is a ninth resistivity. Here, the sixth resistivity is greater than the seventh resistivity, the seventh resistivity is greater than the eighth resistivity, the eighth resistivity is greater than the ninth resistivity, and the fifth resistivity is between the seventh and the eighth resistivities.

According to the method for operating the resistance type memory device disclosed in an embodiment of the present invention, the sixth resistivity exceeds 0.25 ohms-cm, the seventh resistivity ranges from 0.15 ohms-cm to 0.25 ohms-cm, the eighth resistivity ranges from 0.09 ohms-cm to 0.15 ohms-cm, and the ninth resistivity is less than 0.09 ohms-cm.

According to the method for operating the resistance type memory disclosed in an embodiment of the present invention, as the resistance type memory device is in the first storage state, the third negative pulse voltage is applied to the resistance type memory device so as to program the same to be in the third storage state.

According to the method for operating the resistance type memory disclosed in an embodiment of the present invention, as the resistance type memory device is in the first storage state, the fourth negative pulse voltage is applied to the resistance type memory device so as to program the same to be in the fourth storage state.

According to the method for operating the resistance type memory disclosed in an embodiment of the present invention, as the resistance type memory device is in the second storage state, the fourth negative pulse voltage is applied to the resistance type memory device so as to program the same to be in the fourth storage state.

According to the method for operating the resistance type memory disclosed in an embodiment of the present invention, as the resistance type memory device is in the fourth storage state, a fifth positive pulse voltage is applied to the resistance type memory device so as to program the same to be in the second storage state. As the resistance type memory device is in the fourth storage state, a sixth positive pulse voltage is applied to the resistance type memory device so as to program the same to be in the third storage state. Here, the first positive pulse voltage exceeds the fifth positive pulse voltage, and the fifth positive pulse voltage exceeds the sixth positive pulse voltage.

According to the method for operating the resistance type memory disclosed in an embodiment of the present invention, as the resistance type memory device is in the third storage state, a seventh positive pulse voltage is applied to the resistance type memory device so as to program the same to be in the first storage state. As the resistance type memory device is in the third storage state, an eighth positive pulse voltage is applied to the resistance type memory device so as to program the same to be in the second storage state. Here, the seventh positive pulse voltage exceeds the eighth positive pulse voltage.

According to the method for operating the resistance type memory disclosed in an embodiment of the present invention, as the resistance type memory device is in the second storage state, a ninth positive pulse voltage is applied to the resistance type memory device so as to program the same to be in the first storage state.

The present invention further provides a method for operating a resistance type memory device which is disposed on a substrate and includes a tungsten electrode, an upper electrode disposed on the tungsten electrode, and a tungsten oxide layer disposed between the tungsten electrode and the upper electrode. The method for operating the resistance type memory device includes applying a first negative pulse voltage to the resistance type memory device in an initial state at first, so as to program the same to be in a first storage state. Then, as the resistance type memory device is in the first storage state, a second positive pulse voltage is applied to the resistance type memory device so as to program the same to be in a second storage state. Then, as the resistance type memory device is in the second storage state, a third positive pulse voltage is applied to the resistance type memory device so as to program the same to be in a third storage state. Thereafter, as the resistance type memory device is in the third storage state, a fourth positive pulse voltage is applied to the resistance type memory device so as to program the same to be in a fourth storage state. Afterwards, as the resistance type memory device is in the fourth storage state, the first negative pulse voltage is applied to the resistance type memory device so as to program the same to be in the first storage state. Here, the second positive pulse voltage is less than the third positive pulse voltage, and the third positive pulse voltage is less than the fourth positive pulse voltage.

According to the method for operating the resistance type memory device disclosed in another embodiment of the present invention, the resistivity of the resistance type memory device in an initial state is a tenth resistivity, the resistivity of the resistance type memory device in the first storage state is an eleventh resistivity, the resistivity of the resistance type memory device in the second storage state is a twelfth resistivity, the resistivity of the resistance type memory device in the third storage state is a thirteenth resistivity, and the resistivity of the resistance type memory device in the fourth storage state is a fourteenth resistivity. Here, the eleventh resistivity is less than the twelfth resistivity, the twelfth resistivity is less than the thirteenth resistivity, the thirteenth resistivity is less than the fourteenth resistivity, and the tenth resistivity is between the twelfth and the thirteenth resistivities.

According to the method for operating the resistance type memory device disclosed in another embodiment of the present invention, the eleventh resistivity is less than 0.09 ohms-cm, the twelfth resistivity ranges from 0.09 ohms-cm to 0.15 ohms-cm, the thirteenth resistivity ranges from 0.15 ohms-cm to 0.25 ohms-cm, and the fourteenth resistivity exceeds 0.25 ohms-cm.

According to the method for operating the resistance type memory disclosed in another embodiment of the present invention, as the resistance type memory device is in the first storage state, the third positive pulse voltage is applied to the resistance type memory device so as to program the same to be in the third storage state.

According to the method for operating the resistance type memory disclosed in another embodiment of the present invention, as the resistance type memory device is in the first storage state, the fourth positive pulse voltage is applied to the resistance type memory device so as to program the same to be in the fourth storage state.

According to the method for operating the resistance type memory disclosed in another embodiment of the present invention, as the resistance type memory device is in the second storage state, the fourth positive pulse voltage is applied to the resistance type memory device so as to program the same to be in the fourth storage state.

According to the method for operating the resistance type memory disclosed in another embodiment of the present invention, as the resistance type memory device is in the fourth storage state, a fifth negative pulse voltage is applied to the resistance type memory device so as to program the same to be in the second storage state. As the resistance type memory device is in the fourth storage state, a sixth negative pulse voltage is applied to the resistance type memory device so as to program the same to be in the third storage state. Here, an absolute value of the first negative pulse voltage is greater than that of the fifth negative pulse voltage, and the absolute value of the fifth negative pulse voltage is greater than that of the sixth negative pulse voltage.

According to the method for operating the resistance type memory disclosed in another embodiment of the present invention, as the resistance type memory device is in the third storage state, a seventh negative pulse voltage is applied to the resistance type memory device so as to program the same to be in the first storage state. As the resistance type memory device is in the third storage state, an eighth negative pulse voltage is applied to the resistance type memory device so as to program the same to be in the second storage state. Here, the absolute value of the seventh negative pulse voltage is greater than that of the eighth negative pulse voltage.

According to the method for operating the resistance type memory disclosed in another embodiment of the present invention, as the resistance type memory device is in the second storage state, a ninth negative pulse voltage is applied to the resistance type memory device so as to program the same to be in the first storage state.

According to the method for operating the resistance type memory disclosed in an embodiment of the present invention, the method of manipulating the pulse-applied time of the pulse voltage includes choosing the resistance type memory devices with predetermined ending states in the first storage state, the second storage state, the third storage state, and the fourth storage state. Then, a first pulse-applied time is applied to each of the resistance type memory devices which is with predetermined ending states in the second storage state. Next, a second pulse-applied time is applied to each of the resistance type memory devices which is with predetermined ending states in the third storage state. Thereafter, a third pulse-applied time is applied to each of the resistance type memory devices which is with predetermined ending states in the fourth storage state. Here, the first pulse-applied time is less than the second pulse-applied time, and the second pulse-applied time is less than the third pulse-applied time.

In view of the above, the resistance type memory device provided by the present invention is a multi-level memory cell having the tungsten oxide layer. The resistivity thereof is adjustable through applying the pulse voltage to the tungsten oxide layer. Therefore, the resistance type memory device of the present invention is capable of performing the multiple-bit storage at a storage point. Moreover, the resistance type memory device of the present invention can be applied to both the non-volatile and the volatile memories. In addition, the resistance type memory device has high thermal stability, so that the data storage function of the resistance type memory device is not deteriorated in a high temperature environment.

Furthermore, the method for fabricating the resistance type memory device provided by the present invention adopts a self-aligned manufacturing technology. Thus, no additional masks are required, and the method for fabricating said resistance type memory device can be easily integrated into the current manufacturing process.

On the other hand, the method for operating the resistance type memory provided by the present invention is to apply voltages to the tungsten oxide layers of the resistance type memory devices. Due to different resistivities of the tungsten oxide layers, the resistance type memory devices correspondingly have four different data storage states. Thereby, the requirement of multiple-bit storage at a storage point can be satisfied.

Additionally, in the method for operating the resistance type memory device provided by the present invention, a plurality of the programming operations can be performed repeatedly on the resistance type memory device through applying different pulse voltages, and the programming speed can be significantly increased.

In order to the make the aforementioned and other objects, features and advantages of the present invention comprehensible, a preferred embodiment accompanied with figures are described in detail below.

DESCRIPTION OF EMBODIMENTS

Figure 1:
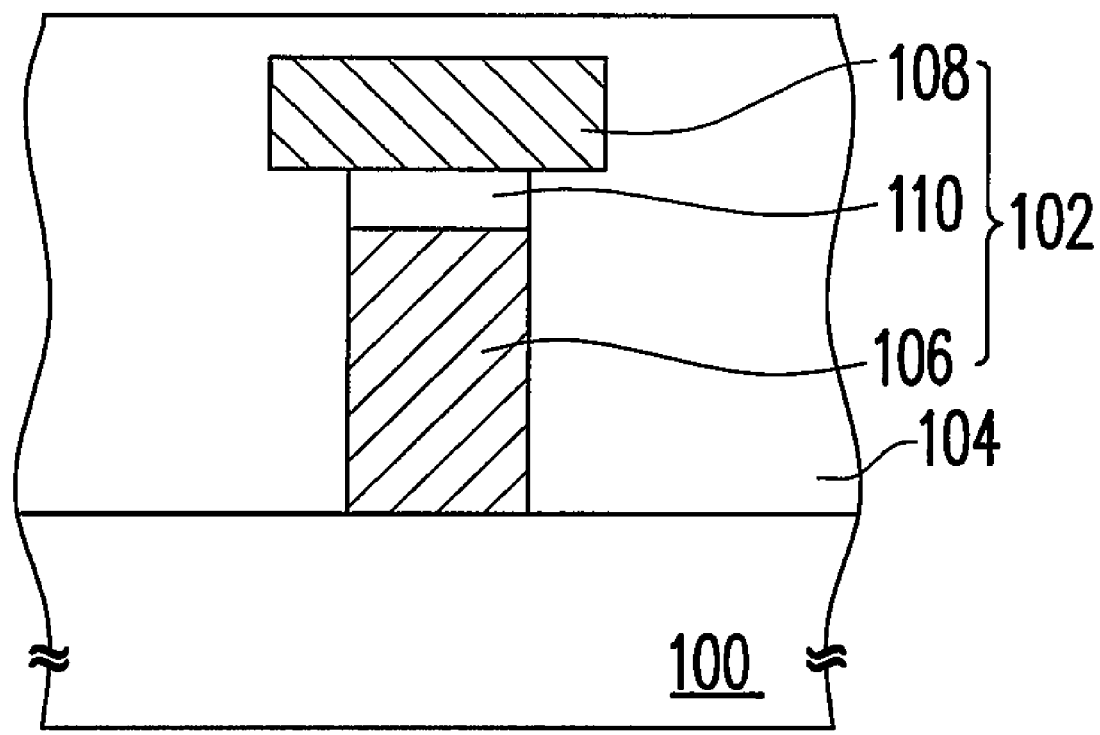
FIG. 1 is a cross-sectional view illustrating a resistance type memory device according to an embodiment of the present invention.

FIG. 1 is a cross-sectional view illustrating a resistance type memory device according to an embodiment of the present invention.

Referring to FIG. 1, the resistance type memory device 102 is disposed on a substrate 100, for example, in a dielectric layer 104 on the substrate 100. The substrate 100 is, for example, a silicon substrate, and the material of the dielectric layer 104 is silicon oxide, for example.

The resistance type memory device 102 includes a tungsten electrode 106, an upper electrode 108, and a tungsten oxide layer 110.

The tungsten electrode 106 is disposed on the substrate 100 and employed as a single electrode. The method for forming the tungsten electrode 106 includes, for example, performing the CVD process.

The upper electrode 108 is disposed on the tungsten electrode 106, and the material of the upper electrode 108 is, for example, semiconductor materials e.g. doped polysilicon, of metal materials e.g. aluminum and copper, and of metal barrier layers e.g. titanium nitride (TiN) and tantalum nitride (TaN). The method for forming the upper electrode 108 includes, for example, performing the CVD process or the physical vapor deposition process.

The tungsten oxide layer 110 is sandwiched between the tungsten electrode 106 and the upper electrode 108, and the resistivity of the tungsten oxide layer 110 can be altered by applying voltages or currents thereto. The method for forming the tungsten oxide layer includes, for example, performing the plasma oxidation process.

The resistance type memory device 102 provided by the aforesaid embodiment includes the tungsten oxide layer 110. Accordingly, the resistivity of the tungsten oxide layer 110 can be adjusted by applying a pulse voltage thereto. Thereby, the resistance type memory device 102 is capable of implementing a multiple-bit storage operation at a storage point. Moreover, the resistance type memory device 102 can be applied to the non-volatile and the volatile memories. In addition, the resistance type memory device 102 has high thermal stability, so that the data storage function thereof is not deteriorated in a high temperature environment (e.g. at 150° C.).

Figure 2A:
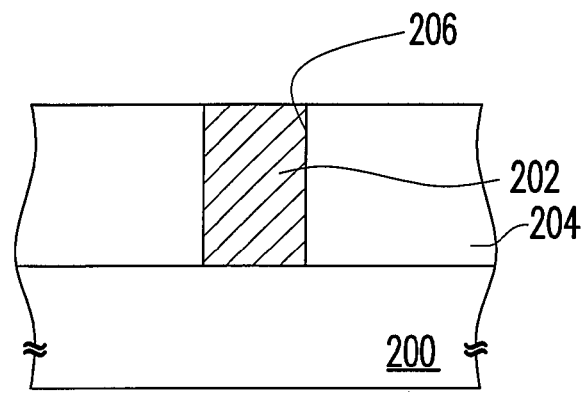
FIGS. 2A to 2C are cross-sectional flow charts illustrating a process of fabricating the resistance type memory device according to an embodiment of the present invention.
Figure 2B:
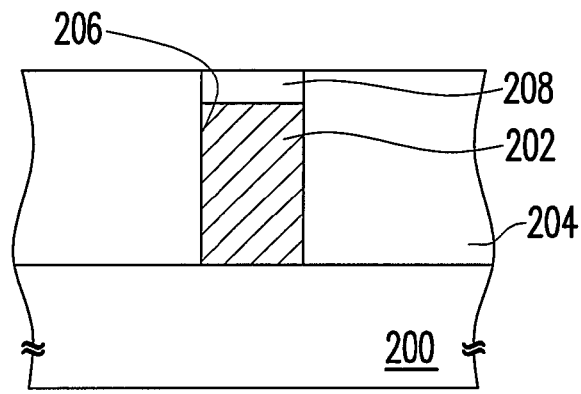
Figure 2C:
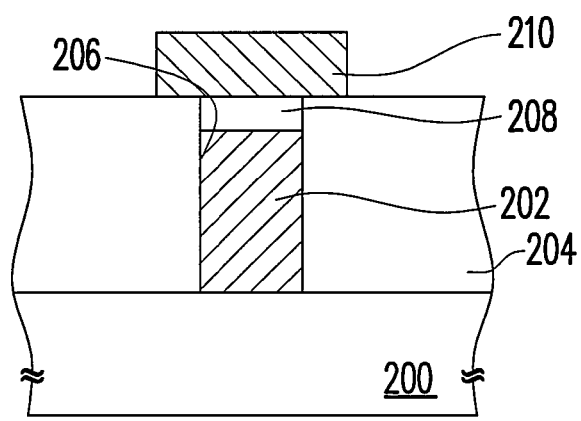

FIGS. 2A to 2C are cross-sectional flow charts illustrating a process of fabricating the resistance type memory device according to an embodiment of the present invention.

As is shown in FIG. 2A, a substrate 200 is provided. The substrate 200 comprises, for example, a silicon substrate.

A tungsten electrode 202 is then formed on the substrate 200. The method for forming the tungsten electrode 202 includes, for example, forming a dielectric layer 204 on the substrate 200, and an opening 206 has been formed in the dielectric layer 204. The material of the dielectric layer 204 is, for example, silicon oxide, and the forming method thereof includes, for example, performing the CVD process. A thickness of the dielectric layer 204 ranges from 100 nm to 1000 nm, for example. Next, a tungsten electrode (not shown) is formed on the dielectric layer 204 and fills the opening 206. The method for forming the tungsten electrode includes, for example, performing the CVD process. Next, the tungsten electrode outside the opening 206 is removed through performing the CMP process.

Referring to FIG. 2B, a tungsten oxide layer 208 is then formed over the tungsten electrode 202. The method for forming the tungsten oxide layer 208 includes, for example, performing the plasma oxidation process. The reactive gas used in the plasma oxidation process is a mixture of oxygen and nitrogen, for example. The plasma required for performing the plasma oxidation process can be formed either inside a reaction chamber or outside the reaction chamber with a later injection thereto.

Next, referring to FIG. 2C, an upper electrode 210 is formed on the tungsten oxide layer 208. The material of the upper electrode 210 is, for example, semiconductor materials e.g. doped polysilicon, metal materials e.g. aluminum and copper, and metal barrier layers e.g. TiN and TaN. The method for forming the upper electrode 210 includes forming an upper electrode layer (not shown) and performing a patterning process on the upper electrode layer. The method for forming the upper electrode layer includes, for example, performing the CVD process or the physical vapor deposition process.

In view of the foregoing, the method for fabricating the resistance type memory device includes oxidizing a part of the tungsten electrode 202 to obtain the tungsten oxide layer 208. Said method adopts a self-aligned manufacturing technology. Thus, no additional masks are required, and the method for fabricating said resistance type memory device can be easily integrated into the current manufacturing process.

The method for operating the resistance type memory will be illustrated in the following paragraphs. The resistance type memory includes a plurality of the resistance type memory devices 102 demonstrated in FIG. 1. Each elements, materials, and forming methods of the resistance type memory devices 102 have already been well described, and detailed descriptions will not be repeated hereinafter.

Referring to FIG. 1, the method for operating the resistance type memory devices 102 includes applying the pulse voltage to the tungsten oxide layer 110 so as to adjust the resistivity thereof.

Here, the resistivity of the tungsten oxide layer 110 refers to a first resistivity when no pulse voltage is applied to the tungsten oxide layer 110, and the resistance type memory device 102 is in a first storage state (0,1).

When the resistivity of the tungsten oxide layer 110 is adjusted to be a second resistivity, the resistance type memory device 102 is programmed to be in a second storage state (0,0).

When the resistivity of the tungsten oxide layer 110 is adjusted to be a third resistivity, the resistance type memory device 102 is programmed to be in a third storage state (1,0).

When the resistivity of the tungsten oxide layer 110 is adjusted to be a fourth resistivity, the resistance type memory device 102 is programmed to be in a fourth storage state (1,1).

Here, the second resistivity is greater than the first resistivity, the first resistivity is greater than the third resistivity, and the third resistivity is greater than the fourth resistivity. The first resistivity ranges from 0.4 ohms-cm to 5.7 ohms-cm, the second resistivity exceeds 5.7 ohms-cm, the third resistivity ranges from 0.07 ohms-cm to 0.4 ohms-cm, and the fourth resistivity is less than 0.07 ohms-cm, for example.

In the aforesaid method for operating the resistance type memory, the method of adjusting the resistivity of the tungsten oxide layer 110 of the resistance type memory device 102 includes manipulating a pulse-applied number of the pulse voltage and a pulse-applied time thereof. Detailed descriptions are provided as follows.

First of all, the method for operating the resistance type memory through manipulating the pulse-applied number of the pulse voltage is introduced.

When no pulse voltage is applied to the tungsten oxide layer 110, the resistance type memory device 102 is in the first storage state (0,1).

When the pulse-applied number is less than a first critical number Nc1, the resistance type memory device 102 is programmed to be in the second storage state (0,0).

When the pulse-applied number ranges from the first critical number $N_{c1}$ to a second critical number $N_{c2}$, the resistance type memory device 102 is programmed to be in the third storage state (1,0).

When the pulse-applied number is more than the second critical number $N_{c2}$, the resistance type memory device 102 is programmed to be in the fourth storage state (1,1).

Here, the second critical number $N_{c2}$ is greater than the first critical number $N_{c1}$. For example, when 1.5V of the pulse voltage is applied to the tungsten oxide layer 110 for 60-80 nsec, the first critical number $N_{c1}$ and the second critical number $N_{c2}$ are approximately 60 and 120, respectively.

The pulse-applied number of the pulse voltage is, for example, simultaneously or independently manipulated when an operation is performed on the resistance type memory device 102 of the resistance type memory.

Figure 3:
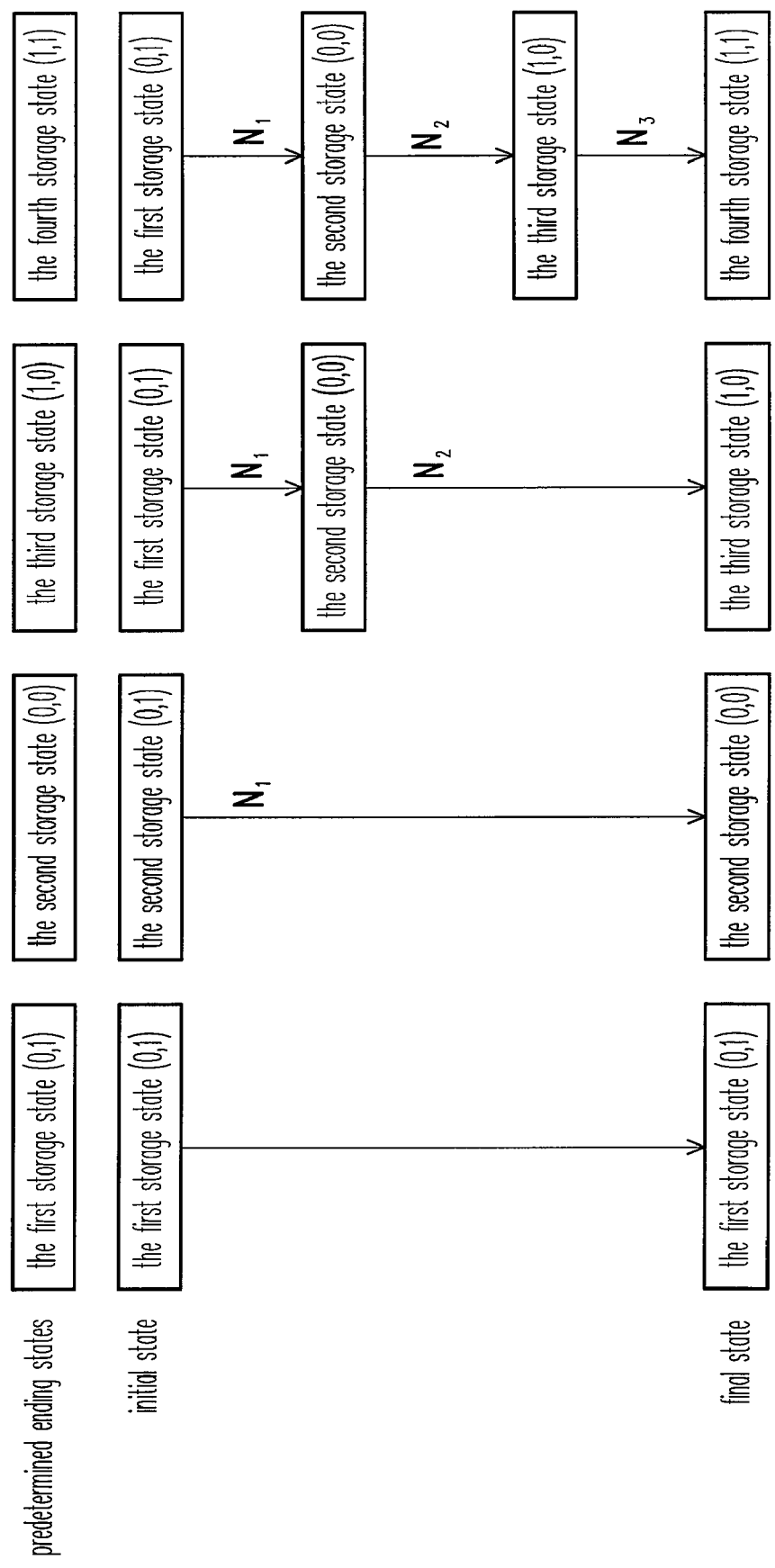
FIG. 3 is a schematic view illustrating a method for operating the resistance type memory according to a first embodiment of the present invention.

FIG. 3 is a schematic view illustrating a method for operating the resistance type memory according to a first embodiment of the present invention.

Please refer to FIGS. 1 and 3 together. When an operation of simultaneously manipulating the pulse-applied number is performed on the resistance type memory, the resistance type memory devices 102 are with predetermined ending states in the first storage state (0,1), the second storage state (0,0), the third storage state (1,0), and the fourth storage state (1,1). When no pulse voltage is applied, each of the resistance type memory devices 102 is initially in the first storage state (0,1). Since no pulse voltage is applied to the resistance type memory device 102 with predetermined ending states in the first storage state (0,1), the final state of said resistance type memory device 102 remains in the first storage state (0,1).

Next, a first pulse-applied number $N_1$ of the pulse voltage is applied to each of the memory devices 102 other than to the resistance type memory devices 102 with predetermined ending states in the first storage state (0,1). Here, the first pulse-applied number $N_1$ is less than the first critical number $N_{c1}$. And, aside from the resistance type memory devices 102 with predetermined ending states in the first storage state (0,1), each of the memory devices is programmed from the first storage state (0,1) to the second storage state (0,0) as a final state.

Then, a second pulse-applied number $N_2$ of the pulse voltage is applied to each of the memory devices 102 other than to the resistance type memory devices 102 with predetermined ending states in the first storage state (0,1) and the second storage state (0,0). The total of the first pulse-applied number $N_1$ and of the second pulse-applied number $N_2$ ranges from the first critical number $N_{c1}$ to the second critical number $N_{c2}$. And, aside from the resistance type memory devices 102 with predetermined ending states in the first storage state (0,1) and the second storage state (0,0), each of the memory devices is programmed from the second storage state (0,0) to the third storage state (1,0) as the final state.

Thereafter, a third pulse-applied number $N_3$ of the pulse voltage is applied to each of the memory devices 102 other than to the resistance type memory devices 102 with predetermined ending states in the first storage state (0,1), the second storage state (0,0), and the third storage state (1,0). The total of the first pulse-applied number $N_1$, the second pulse-applied number $N_2$, and the third pulse-applied number $N_3$ is more than the second critical number $N_{c2}$. And, aside from the resistance type memory devices 102 with predetermined ending states in the first storage state (0,1), the second storage state (0,0), and the third storage state (1,0), each of the memory devices 102 is programmed from the third storage state (1,0) to the fourth storage state (1,1) as the final state.

Figure 4:
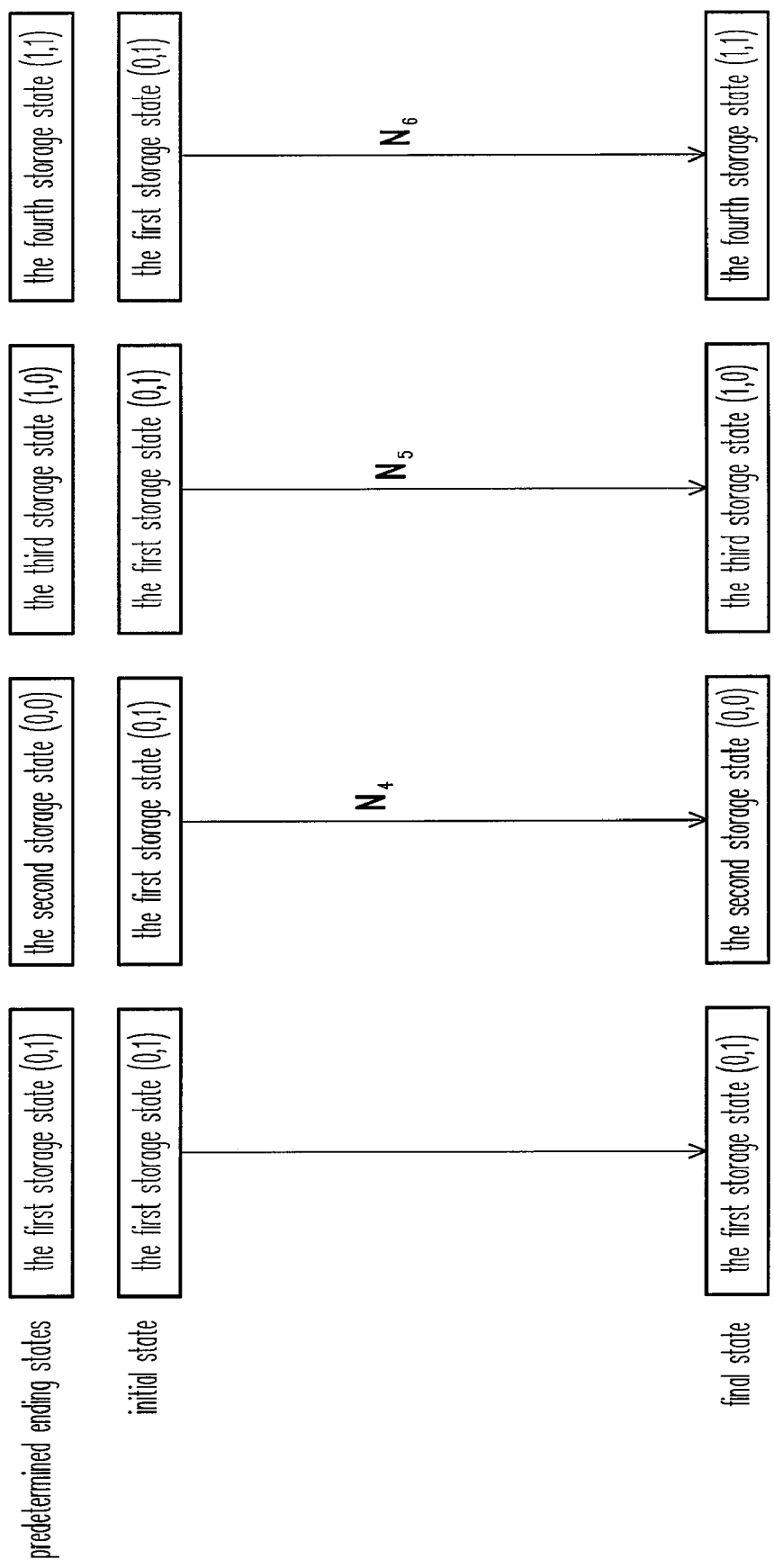
FIG. 4 is a schematic view illustrating a method for operating the resistance type memory according to a second embodiment of the present invention.

FIG. 4 is a schematic view illustrating a method for operating the resistance type memory according to a second embodiment of the present invention.

Please refer to FIGS. 1 and 4 together. When a process of independently manipulating the pulse-applied number is performed on the resistance type memory, the resistance type memory devices 102 are with predetermined ending states in the first storage state (0,1), the second storage state (0,0), the third storage state (1,0), and the fourth storage state (1,1). When no pulse voltage is applied, each of the resistance type memory devices 102 is initially in the first storage state (0,1). Since no pulse voltage is applied to the resistance type memory device 102 with predetermined ending states in the first storage state (0,1), the final state of said resistance type memory device 102 remains in the first storage state (0,1).

Then, a fourth pulse-applied number $N_4$ of the pulse voltage is applied to each of the resistance type memory devices 102 which is with predetermined ending states in the second storage state (0,0). Here, the fourth pulse-applied number $N_4$ is less than the first critical number $N_{c1}$, and thereby each of the resistance type memory devices 102 with predetermined ending states in the second storage state (0,0) remains in the second storage state (0,0) as the final state.

Next, a fifth pulse-applied number $N_5$ of the pulse voltage is applied to each of the resistance type memory devices 102 which is with predetermined ending states in the third storage state (1,0). Here, the fifth pulse-applied number $N_5$ ranges from the first critical number $N_{c1}$ to the second critical number $N_{c2}$. Thereby, each of the resistance type memory devices 102 with predetermined ending states in the third storage state (1,0) remains in the third storage state (1,0) as the final state.

Thereafter, a sixth pulse-applied number $N_6$ of the pulse voltage is applied to each of the resistance type memory devices 102 which is with predetermined ending states in the fourth storage state (1,1). Here, the sixth pulse-applied number $N_6$ is more than the second critical number $N_{c2}$. Thereby, each of the resistance type memory devices 102 with predetermined ending states in the fourth storage state (1,1) remains in the fourth storage state (1,1) as the final state.

The method for operating the resistance type memory through manipulating the pulse-applied time of the pulse voltage is introduced hereinafter.

Figure 5:
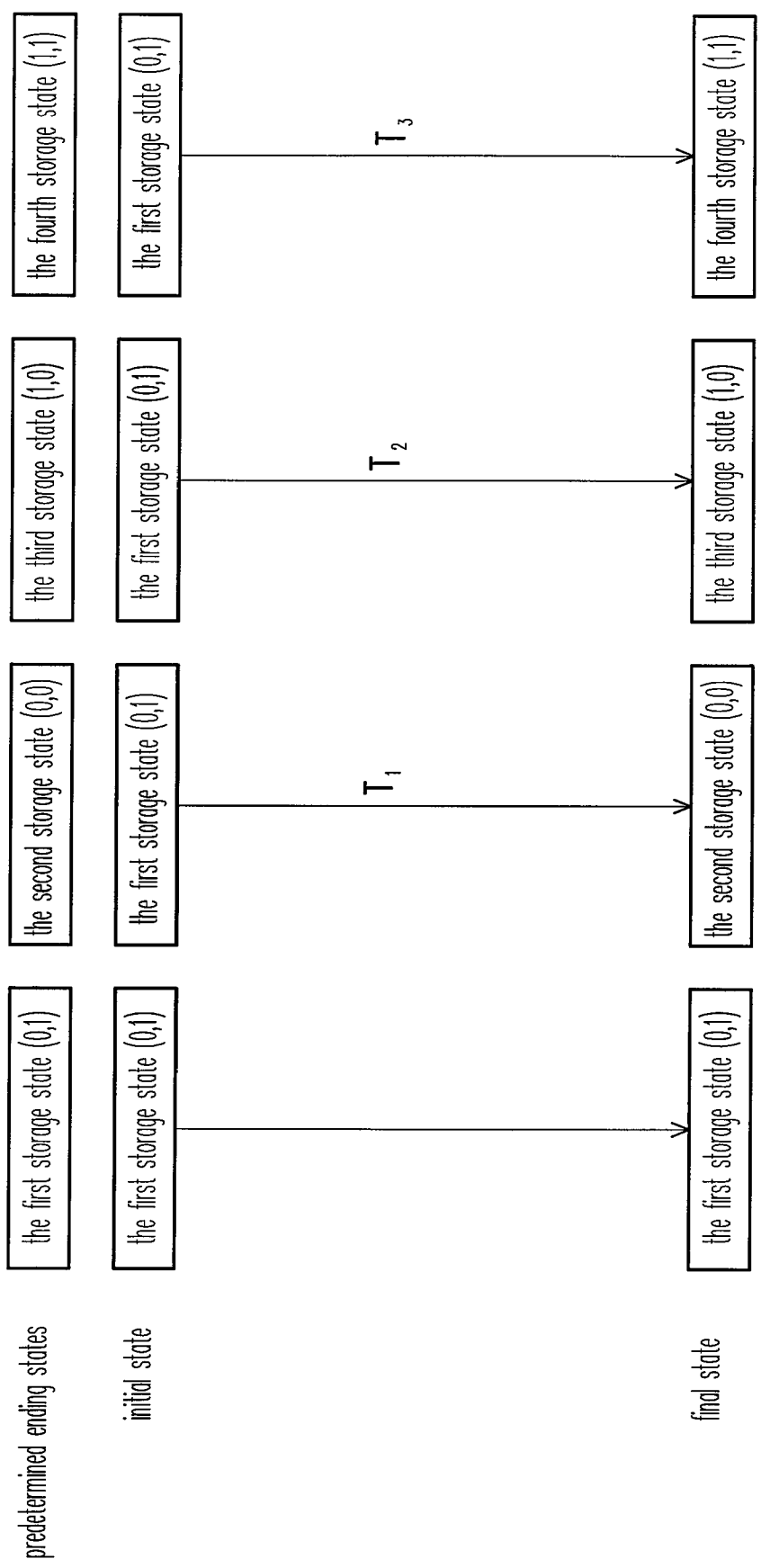
FIG. 5 is a schematic view illustrating a method for operating the resistance type memory according to a third embodiment of the present invention.

FIG. 5 is a schematic view illustrating a method for operating the resistance type memory according to a third embodiment of the present invention.

Please refer to FIGS. 1 and 5 together. First, the resistance type memory devices 102 are with predetermined ending states in the first storage state (0,1), the second storage state (0,0), the third storage state (1,0), and the fourth storage state (1,1). When no pulse voltage is applied, each of the resistance type memory devices 102 is initially in the first storage state (0,1). Since no pulse voltage is applied to the resistance type memory device 102 with predetermined ending states in the first storage state (0,1), the final state of said resistance type memory device 102 remains in the first storage state (0,1).

Then, a first pulse-applied time $T_1$ is applied to each of the resistance type memory devices 102 which is with predetermined ending states in the second storage state (0,0). Thereby, each of the resistance type memory devices 102 with predetermined ending states in the second storage state (0,0) remains in the second storage state (0,0) as the final state.

Next, a second pulse-applied time $T_2$ is applied to each of the resistance type memory devices 102 which is with predetermined ending states in the third storage state (1,0). Thereby, each of the resistance type memory devices 102 with predetermined ending states in the third storage state (1,0) remains in the third storage state (1,0) as the final state.

Thereafter, a third pulse-applied time $T_3$ is applied to each of the resistance type memory devices 102 which is with predetermined ending states in the fourth storage state (1,1). Thereby, each of the resistance type memory devices 102 with predetermined ending states in the fourth storage state (1,1) remains in the fourth storage state (1,1) as the final state.

Here, the first pulse-applied time $T_1$ is less than the second pulse-applied time $T_2$, and the second pulse-applied time $T_2$ is less than the third pulse-applied time $T_3$. For example, when 1.5V of the pulse voltage is applied to each of the resistance type memory devices 102, the first pulse-applied time $T_1$ is approximately 60~80 nsec, the second pulse-applied time $T_2$ is approximately 200~500 nsec, and the third pulse-applied time $T_3$ is approximately 800~1000 nsec.

In view of the aforesaid embodiments, it is known that the method for operating the resistance type memory is to apply voltages to the tungsten oxide layers of the resistance type memory devices so as to adjust the resistivities thereof. Due to different resistivities of the tungsten oxide layers, the resistance type memory devices correspondingly have four different data storage states. Thereby, the requirement of multiple-bit storage at a storage point can be satisfied.

Figure 6:
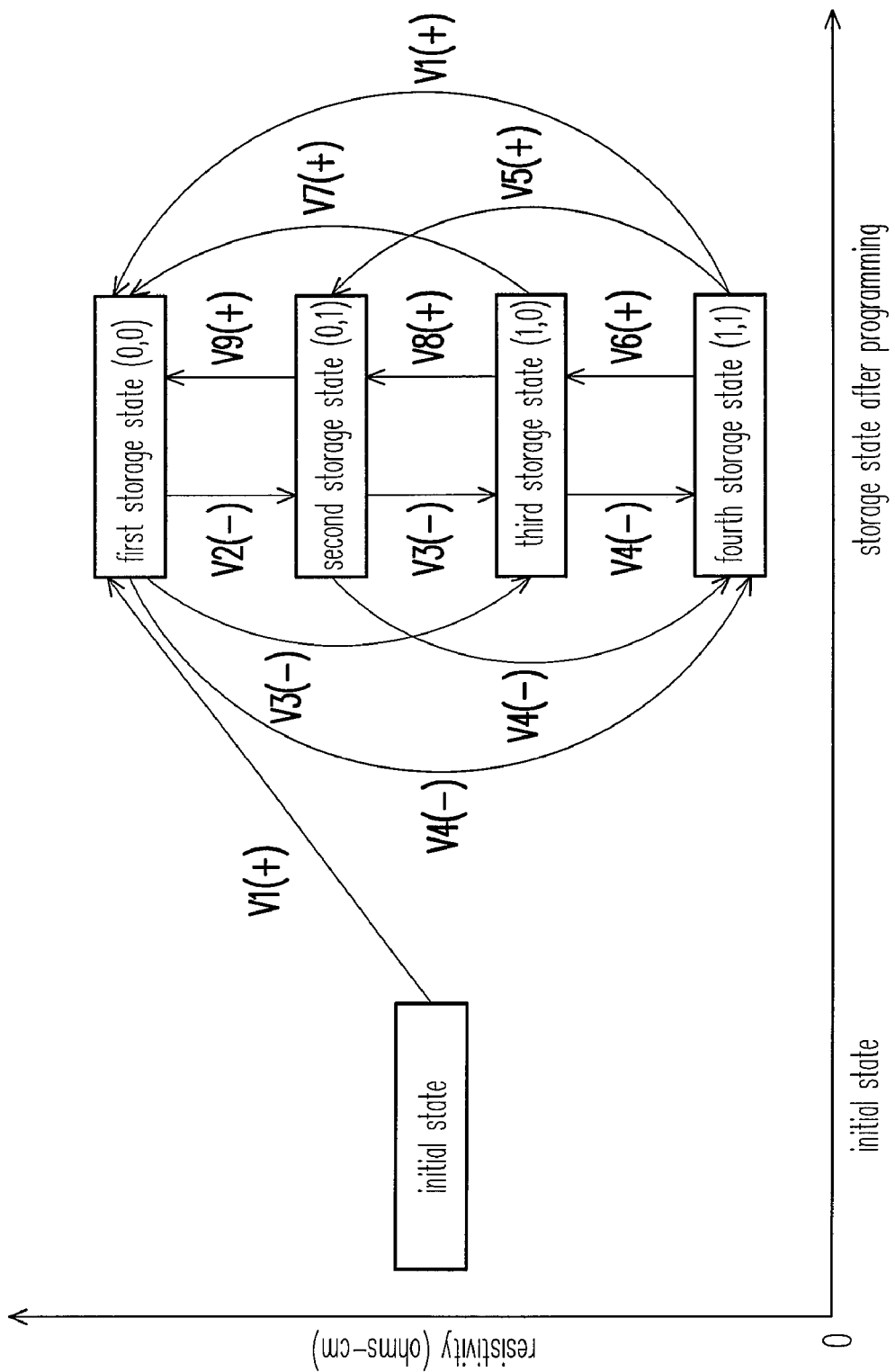
FIG. 6 is a schematic view illustrating a method for operating a resistance type memory device 102 according to a fourth embodiment of the present invention.

FIG. 6 is a schematic view illustrating a method for operating a resistance type memory device according to a fourth embodiment of the present invention.

First, referring to FIGS. 1 and 6 together, a first positive pulse voltage V1(+) is applied to a resistance type memory device 102 in an initial state, so as to program the same to be in a first storage state (0,0).

Then, as the resistance type memory device 102 is in the first storage state (0,0), a second negative pulse voltage V2(−) is applied to the resistance type memory device 102, so as to program the same to be in a second storage state (0,1).

Next, as the resistance type memory device 102 is in the second storage state (0,1), a third negative pulse voltage V3(−) is applied to the resistance type memory device 102, so as to program the same to be in a third storage state (1,0).

Thereafter, as the resistance type memory device 102 is in the third storage state (1,0), a fourth negative pulse voltage V4(−) is applied to the resistance type memory device 102, so as to program the same to be in a fourth storage state (1,1).

Afterwards, as the resistance type memory device 102 is in the fourth storage state (1,1), the first positive pulse voltage V1(+) is applied to the resistance type memory device 102, so as to program the same to be in the first storage state (0,0). Accordingly, a plurality of programming operations can be performed repeatedly on the resistance type memory device 102.

Here, the value correlations of various voltages applied to the resistance type memory device 102 in various states are as follows: an absolute value of the second negative pulse voltage V2(−) is less than that of the third negative pulse voltage V3(−), and the absolute value of the third negative pulse voltage V3(−) is less than that of the fourth negative pulse voltage V4(−). According to one embodiment, the first positive pulse voltage V1(+) is 15V, for example. The second negative pulse voltage V2(−) is −3.3V, for example. The third negative pulse voltage V3(−) is −6V, for example. The fourth negative pulse voltage V4(−) is −13V, for example.

Moreover, the resistivity of the resistance type memory device 102 in the initial state is a fifth resistivity, the resistivity of the resistance type memory device 102 in the first storage state (0,0) is a sixth resistivity, the resistivity of the resistance type memory device 102 in the second storage state (0,1) is a seventh resistivity, the resistivity of the resistance type memory device 102 in the third storage state (1,0) is an eighth resistivity, and the resistivity of the resistance type memory device 102 in the fourth storage state (1,1) is a ninth resistivity. Here, the sixth resistivity is greater than the seventh resistivity, the seventh resistivity is greater than the eighth resistivity, the eighth resistivity is greater than the ninth resistivity, and the fifth resistivity is between the seventh and the eighth resistivities. The sixth resistivity is greater than 0.25 ohms-cm, for example. The seventh resistivity ranges from 0.15 ohms-cm to 0.25 ohms-cm, for example. The eighth resistivity ranges from 0.09 ohms-cm to 0.15 ohms-cm, for example. The ninth resistivity is less than 0.09 ohms-cm, for example.

It should be noted that the resistance type memory device 102 in the first storage state (0,0) can be directly programmed to be in the third storage state (1,0) or in the fourth storage state (1,1). As the resistance type memory device 102 is in the first storage state (0,0), the third negative pulse voltage V3(−) is applied to the resistance type memory device 102, and thereby the resistance type memory device 102 can be directly programmed to be in the third storage state (1,0). As the resistance type memory device 102 is in the first storage state (0,0), the fourth negative pulse voltage V4(−) is applied to the resistance type memory device 102, and thereby the resistance type memory device 102 can be directly programmed to be in the fourth storage state (1,1).

Likewise, the fourth negative pulse voltage V4(−) is applied to the resistance type memory device 102 in the second storage (0,1), and thereby the resistance type memory device 102 can be directly programmed to be in the fourth storage state (1,1).

Furthermore, the resistance type memory device 102 in the fourth storage state (1,1) can be directly programmed to be in the second storage state (0,1) or in the third storage state (1,0). As the resistance type memory device 102 is in the fourth storage state (1,1), a fifth positive pulse voltage V5(+) is applied to the resistance type memory device 102, and thereby the resistance type memory device 102 can be directly programmed to be in the second storage state (0,1). As the resistance type memory device 102 is in the fourth storage state (1,1), a sixth positive pulse voltage V6(+) is applied to the resistance type memory device 102, and thereby the resistance type memory device 102 can be directly programmed to be in the third storage state (1,0). Here, the first positive pulse voltage V1(+) exceeds the fifth positive pulse voltage V5(+), and the fifth positive pulse voltage V5(+) exceeds the sixth positive pulse voltage V6(+).

Similarly, the resistance type memory device 102 in the third storage state (1,0) can be directly programmed to be in the first storage state (0,0) or in the second storage state (0,1). As the resistance type memory device 102 is in the third storage state (1,0), a seventh positive pulse voltage V7(+) is applied to the resistance type memory device 102, and thereby the resistance type memory device 102 can be directly programmed to be in the first storage state (0,0). As the resistance type memory device 102 is in the third storage state (1,0), an eighth positive pulse voltage V8(+) is applied to the resistance type memory device 102, and thereby the resistance type memory device 102 can be directly programmed to be in the second storage state (0,1). Here, the seventh positive pulse voltage V7(+) exceeds the eighth positive pulse voltage V8(+).

Likewise, a ninth positive pulse voltage V9(+) is applied to the resistance type memory device 102 in the second storage (0,1), and thereby the resistance type memory device 102 can be directly programmed to be in the first storage state (0,0).

Figure 7:
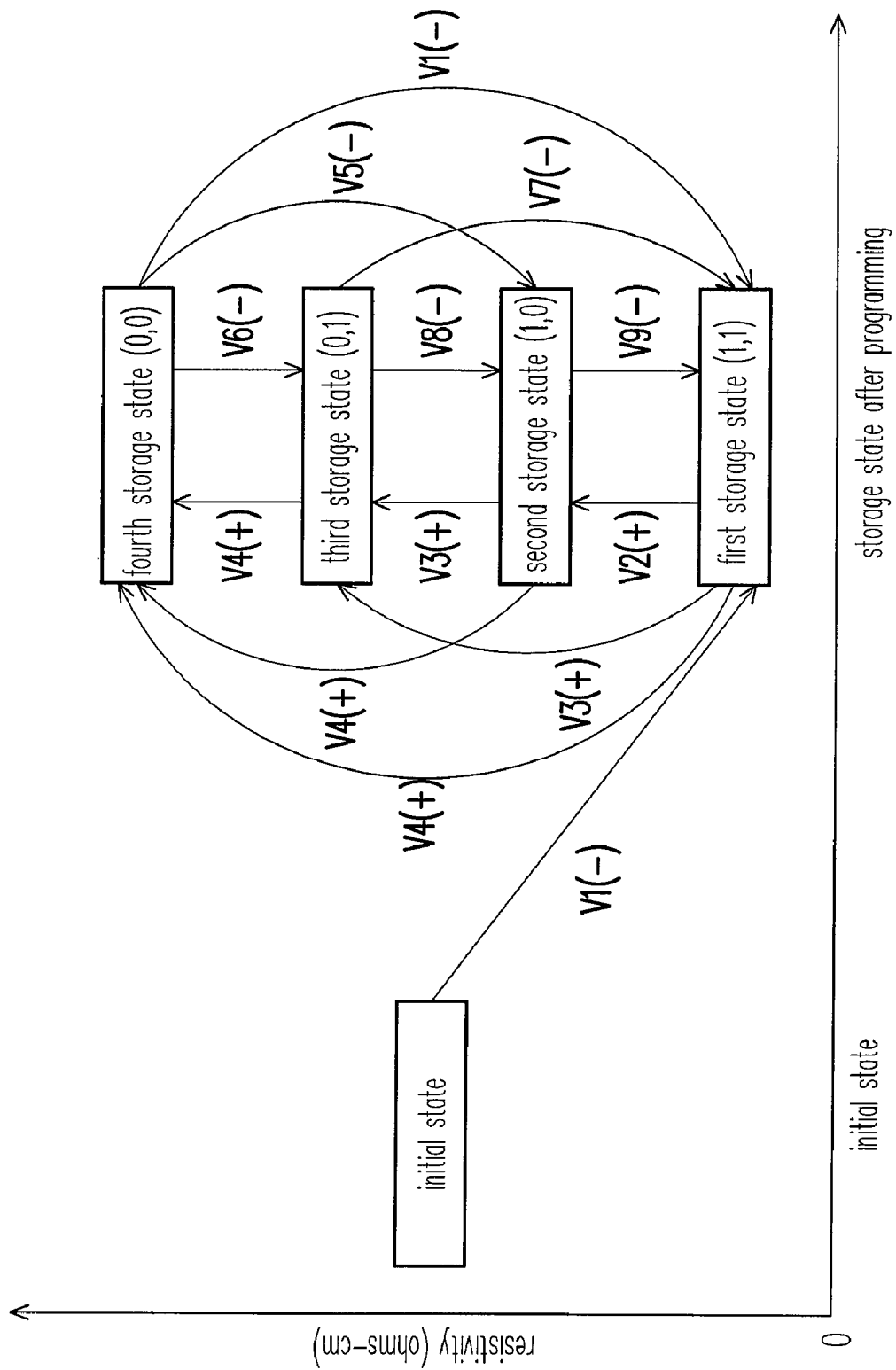
FIG. 7 is a schematic view illustrating a method for operating the resistance type memory device 102 according to a fifth embodiment of the present invention.

FIG. 7 is a schematic view illustrating a method for operating a resistance type memory device 102 according to a fifth embodiment of the present invention.

First, referring to FIGS. 1 and 7 together, a first negative pulse voltage V1(−) is applied to the resistance type memory device 102 in an initial state, so as to program the same to be in a first storage state (1,1).

Then, as the resistance type memory device 102 is in the first storage state (1,1), a second positive pulse voltage V2(+) is applied to the resistance type memory device 102, so as to program the same to be in a second storage state (1,0).

Next, as the resistance type memory device 102 is in the second storage state (1,0), a third positive pulse voltage V3(+) is applied to the resistance type memory device 102, so as to program the same to be in a third storage state (0,1).

Thereafter, as the resistance type memory device 102 is in the third storage state (0,1), a fourth positive pulse voltage V4(+) is applied to the resistance type memory device 102, so as to program the same to be in a fourth storage state (0,0).

Afterwards, as the resistance type memory device 102 is in the fourth storage state (0,0), the first negative pulse voltage V1(−) is applied to the resistance type memory device 102, so as to program the same to be in the first storage state (1,1). Accordingly, a plurality of programming operations can be performed repeatedly on the resistance type memory device 102.

Here, the value correlations of various voltages applied to the resistance type memory device 102 in various states are as follows: the second positive pulse voltage V2(+) is less than the third positive pulse voltage V3(+), and the third positive pulse voltage V3(+) is less than the fourth positive pulse voltage V4(+).

Moreover, the resistivity of the resistance type memory device 102 in the initial state is a tenth resistivity, the resistivity of the resistance type memory device 102 in the first storage state (1,1) is an eleventh resistivity, the resistivity of the resistance type memory device 102 in the second storage state (1,0) is a twelfth resistivity, the resistivity of the resistance type memory device 102 in the third storage state (0,1)

is a thirteen resistivity, and the resistivity of the resistance type memory device 102 in the fourth storage state (0,0) is a fourteenth resistivity. Here, the eleventh resistivity is less than the twelfth resistivity, the twelfth resistivity is less than the thirteenth resistivity, the thirteenth resistivity is less than the fourteenth resistivity, and the tenth resistivity is between the twelfth and the thirteenth resistivities. The eleventh resistivity is less than 0.09 ohms-cm, for example. The twelfth resistivity ranges from 0.09 ohms-cm to 0.15 ohms-cm, for example. The thirteenth resistivity ranges from 0.15 ohms-cm to 0.25 ohms-cm, for example. The fourteenth resistivity is greater than 0.25 ohms-cm, for example.

It should be noted that the resistance type memory device 102 in the first storage state (1,1) can be directly programmed to be in the third storage state (0,1) or in the fourth storage state (0,0). As the resistance type memory device 102 is in the first storage state (1,1), the third positive pulse voltage V3(+) is applied to the resistance type memory device 102, and thereby the resistance type memory device 102 can be directly programmed to be in the third storage state (0,1). As the resistance type memory device 102 is in the first storage state (1,1), the fourth positive pulse voltage V4(+) is applied to the resistance type memory device 102, and thereby the resistance type memory device 102 can be directly programmed to be in the fourth storage state (0,0).

Likewise, the fourth positive pulse voltage V4(+) is applied to the resistance type memory device 102 in the second storage (1,0), and thereby the resistance type memory device 102 can be directly programmed to be in the fourth storage state (0,0).

Furthermore, the resistance type memory device 102 in the fourth storage state (0,0) can be directly programmed to be in the second storage state (1,0) or in the third storage state (0,1). As the resistance type memory device 102 is in the fourth storage state (0,0), a fifth negative pulse voltage V5(−) is applied to the resistance type memory device 102, and thereby the resistance type memory device 102 can be directly programmed to be in the second storage state (1,0). As the resistance type memory device 102 is in the fourth storage state (0,0), a sixth negative pulse voltage V6(−) is applied to the resistance type memory device 102, and thereby the resistance type memory device 102 can be directly programmed to be in the third storage state (0,1). Here, an absolute value of the first negative pulse voltage V1(−) is greater than that of the fifth negative pulse voltage V5(−), and the absolute value of the fifth negative pulse voltage V5(−) is greater than that of the sixth negative pulse voltage V6(−).

Similarly, the resistance type memory device 102 in the third storage state (0,1) can be directly programmed to be in the first storage state (1,1) or in the second storage state (1,0). As the resistance type memory device 102 is in the third storage state (0,1), a seventh negative pulse voltage V7(−) is applied to the resistance type memory device 102, and thereby the resistance type memory device 102 can be directly programmed to be in the first storage state (1,1). As the resistance type memory device 102 is in the third storage state (0,1), an eighth negative pulse voltage V8(−) is applied to the resistance type memory device 102, and thereby the resistance type memory device 102 can be directly programmed to be in the second storage state (1,0). Here, the absolute value of the seventh negative pulse voltage V7(−) is greater than that of the eighth negative pulse voltage V8(−).

Likewise, a ninth negative pulse voltage V9(−) is applied to the resistance type memory device 102 in the second storage (1,0), and thereby the resistance type memory device 102 can be directly programmed to be in the first storage state (1,1).

In view of the foregoing, in the method for operating the resistance type memory device 102, a plurality of the programming operations can be performed repeatedly on the resistance type memory device through applying the different pulse voltages. Besides, according to said method, the programming speed can be significantly increased. The fastest speed is equal to or less than 9 nsec.

In summary, the present invention has at least the following advantages:

1. The resistance type memory device of the present invention is capable of performing the multiple-bit storage operation at a storage point.

2. The resistance type memory device of the present invention can be applied to the volatile and the non-volatile memories.

3. The resistance type memory device of the present invention has high thermal stability, so that the data storage function of the resistance type memory device is not deteriorated in a high temperature environment.

4. The method for fabricating the resistance type memory device provided by the present invention adopts a self-aligned manufacturing technology. Thus, no additional masks are required, and the method for fabricating said resistance type memory devices can be easily integrated into the current manufacturing process.

5. The method for operating the resistance type memory provided by the present invention satisfies the requirement of the multiple-bit storage at a storage point.

6. The method for operating the resistance type memory device provided by the present invention enables a plurality of the programming operations to be performed repeatedly.

7. Through the method for operating the resistance type memory device provided by the present invention, the programming speed can be significantly increased.

Although the present invention has been disclosed above by the preferred embodiments, they are not intended to limit the present invention. Anybody skilled in the art can make some modifications and alteration without departing from the spirit and scope of the present invention. Therefore, the protecting range of the present invention falls in the appended claims.

What is claimed is:

1. A method for operating a resistance type memory comprising a plurality of resistance type memory devices, each of the resistance type memory devices being disposed on a substrate and comprising a tungsten electrode, an upper electrode disposed on the tungsten electrode, and a tungsten oxide layer sandwiched between the tungsten electrode and the upper electrode, comprising:

applying a pulse voltage to each of the tungsten oxide layers so as to adjust a resistivity thereof, wherein each of the resistivities of each of the tungsten oxide layers refers to a first resistivity when no pulse voltage is applied to any of the tungsten oxide layers, and each of the resistance type memory devices is in a first storage state;

each of the resistance type memory devices is programmed to be in a second storage state when each of the resistivities is adjusted to be a second resistivity;

each of the resistance type memory devices is programmed to be in a third storage state when each of the resistivities is adjusted to a third resistivity; and each of the resistance type memory devices is programmed to be in a fourth storage state when each of the resistivities is adjusted to be a fourth resistivity, wherein the second resistivity is greater than the first resistivity, the first resistivity is greater than the third resistivity, and the third resistivity is greater than the fourth resistivity.

2. The method of operating a resistance type memory device according to claim 1, wherein the first resistivity ranges from 0.4 ohms-cm to 5.7 ohms-cm, the second resistivity exceeds 5.7 ohms-cm, the third resistivity ranges from 0.07 ohms-cm to 0.4 ohms-cm, and the fourth resistivity is less than 0.07 ohms-cm.

3. The method of operating a resistance type memory device according to claim 1, wherein the method for adjusting each of the resistivities comprises manipulating a pulse-applied number of the pulse voltage.

4. The method of operating a resistance type memory device according to claim 3, the method of manipulating the pulse-applied number of the pulse voltage comprising:
keeping each of the resistance type memory devices in the first storage state when no pulse voltage is applied to any of the tungsten oxide layers;
programming each of the resistance type memory devices to the second storage state when the pulse-applied number is less than a first critical number;
programming each of the resistance type memory devices to the third storage state when the pulse-applied number ranges from the first critical number to a second critical number; and
programming each of the resistance type memory devices to the fourth storage state when the pulse-applied number is more than the second critical number, wherein
the second critical number is greater than the first critical number.

5. The method of operating a resistance type memory device according to claim 4, wherein the pulse-applied number of the pulse voltage is simultaneously or independently manipulated.

6. The method of operating a resistance type memory device according to claim 5, wherein the method of simultaneously manipulating the pulse-applied number comprises:
choosing the resistance type memory devices with predetermined ending states in the first storage state, the second storage state, the third storage state, and the fourth storage state;
applying a first pulse-applied number of the pulse voltage to each of the resistance type memory devices other than to the memory devices with predetermined ending states in the first storage state, the first pulse-applied number being less than the first critical number, each of the resistance type memory devices excluding the resistance type memory devices with predetermined ending states in the first storage state being programmed from the first storage state to the second storage state; applying a second pulse-applied number of the pulse voltage to each of the resistance type memory devices other than to the resistance type memory devices with predetermined ending states in the first and the second storage states, the total of the first and the second pulse-applied numbers ranging from the first critical number to the second critical number, each of the resistance type memory devices excluding the resistance type memory devices with predetermined ending states in the first and the second storage states being programmed from the second storage state to the third storage state;
applying a third pulse-applied number of the pulse voltage to each of the resistance type memory devices other than to the resistance type memory devices with predetermined ending states in the first, the second, and the third storage states, the total of the first, the second, and the third pulse-applied numbers being greater than the second critical number, each of the resistance type memory devices excluding the resistance type memory devices with predetermined ending states in the first, the second, and the third storage states being programmed from the third storage state to the fourth storage state.

7. The method of operating a resistance type memory device according to claim 5, wherein the method of independently manipulating the pulse-applied number comprises:
choosing the resistance type memory devices with predetermined ending states in the first storage state, the second storage state, the third storage state, and the fourth storage state;
applying a fourth pulse-applied number of the pulse voltage to each of the resistance type memory devices which is with predetermined ending states in the second storage state, the fourth pulse-applied number being less than the first critical number;
applying a fifth pulse-applied number of the pulse voltage to each of the resistance type memory devices which is with predetermined ending states in the third storage state, the fifth pulse-applied number ranging from the first critical number and the second critical number; and
applying a sixth pulse-applied number of the pulse voltage to each of the resistance type memory devices which is with predetermined ending states in the fourth storage state, the sixth pulse-applied number being greater than the second critical number.

8. The method of operating a resistance type memory device according to claim 1, wherein the method for adjusting each of the resistivities comprises manipulating a pulse-applied time of the pulse voltage.

9. The method of operating a resistance type memory device according to claim 8, the method of manipulating the pulse-applied time of the pulse voltage comprising:
choosing the resistance type memory devices with predetermined ending states in the first storage state, the second storage state, the third storage state, and the fourth storage state;
applying a first pulse-applied time to each of the resistance type memory devices which is with predetermined ending states in the second storage state;
applying a second pulse-applied time to each of the resistance type memory devices which is with predetermined ending states in the third storage state; and
applying a third pulse-applied time to each of the resistance type memory devices which is with predetermined ending states in the fourth storage state, wherein
the first pulse-applied time is less than the second pulse-applied time, and the second pulse-applied time is less than the third pulse-applied time.

10. A method for operating a resistance type memory device disposed on a substrate and comprising a tungsten electrode, an upper electrode disposed on the tungsten electrode, and a tungsten oxide layer sandwiched between the tungsten electrode and the upper electrode, comprising:
applying a first positive pulse voltage to the resistance type memory device when the resistance type memory device is in an initial state, so as to program the same to be in a first storage state;
applying a second negative pulse voltage to the resistance type memory device when the resistance type memory device is in the first storage state, so as to program the same to be in a second storage state;
applying a third negative pulse voltage to the resistance type memory device when the resistance type memory device is in the second storage state, so as to program the same to be in a third storage state;

applying a fourth negative pulse voltage to the resistance type memory device when the resistance type memory device is in the third storage state, so as to program the same to be in a fourth storage state; and applying the first positive pulse voltage to the resistance type memory device when the resistance type memory device is in the fourth storage state, so as to program the same to be in the first storage state, wherein an absolute value of the second negative pulse voltage is less than that of the third negative pulse voltage, and the absolute value of the third negative pulse voltage is less than that of the fourth negative pulse voltage.

11. The method of operating a resistance type memory device according to claim 10, a resistivity of the resistance type memory device in the initial state being a fifth resistivity, the resistivity of the resistance type memory device in the first storage state being a sixth resistivity, the resistivity of the resistance type memory device in the second storage state being a seventh resistivity, the resistivity of the resistance type memory device in the third storage state being an eighth resistivity, the resistivity of the resistance type memory device in the fourth storage state being a ninth resistivity, wherein the sixth resistivity is greater than the seventh resistivity,
the seventh resistivity is greater than the eighth resistivity,
the eighth resistivity is greater than the ninth resistivity, and
the fifth resistivity is between the seventh and the eighth resistivities.

12. The method of operating a resistance type memory device according to claim 11, wherein the sixth resistivity exceeds 0.25 ohms-cm, the seventh resistivity ranges from 0.15 ohms-cm to 0.25 ohms-cm, the eighth resistivity ranges from 0.09 ohms-cm to 0.15 ohms-cm, and the ninth resistivity is less than 0.09 ohms-cm.

13. The method of operating a resistance type memory device according to claim 10, wherein the third negative pulse voltage is applied to the resistance type memory device when the resistance type memory device is in the first storage state, so as to program the same to be in the third storage state.

14. The method of operating a resistance type memory device according to claim 10, wherein the fourth negative pulse voltage is applied to the resistance type memory device when the resistance type memory device is in the first storage state, so as to program the same to be in the fourth storage state.

15. The method of operating a resistance type memory device according to claim 10, wherein the fourth negative pulse voltage is applied to the resistance type memory device when the resistance type memory device is in the second storage state, so as to program the same to be in the fourth storage state.

16. The method of operating a resistance type memory device according to claim 10, wherein a fifth positive pulse voltage is applied to the resistance type memory device when the resistance type memory device is in the fourth storage state, so as to program the same to be in the second storage state, a sixth positive pulse voltage being applied to the resistance type memory device when the resistance type memory device is in the fourth storage state, so as to program the same to be in the third storage state, wherein
the first positive pulse voltage exceeds the fifth positive pulse voltage, and the fifth positive pulse voltage exceeds the sixth positive pulse voltage.

17. The method of operating a resistance type memory device according to claim 10, wherein a seventh positive pulse voltage is applied to the resistance type memory device when the resistance type memory device is in the third storage state, so as to program the same to be in the first storage state, an eighth positive pulse voltage being applied to the resistance type memory device when the resistance type memory device is in the third storage state, so as to program the same to be in the second storage state, wherein
the seventh positive pulse voltage exceeds the eighth positive pulse voltage.

18. The method of operating a resistance type memory device according to claim 10, wherein a ninth positive pulse voltage is applied to the resistance type memory device when the resistance type memory device is in the second storage state, so as to program the same to be in the first storage state.

19. A method for operating a resistance type memory device disposed on a substrate and comprising a tungsten electrode, an upper electrode disposed on the tungsten electrode, and a tungsten oxide layer sandwiched between the tungsten electrode and the upper electrode, comprising:

applying a first negative pulse voltage to the resistance type memory device when the resistance type memory device is in an initial state, so as to program the same to be in a first storage state;

applying a second positive pulse voltage to the resistance type memory device when the resistance type memory device is in the first storage state, so as to program the same to be in a second storage state;

applying a third positive pulse voltage to the resistance type memory device when the resistance type memory device is in the second storage state, so as to program the same to be in a third storage state;

applying a fourth positive pulse voltage to the resistance type memory device when the resistance type memory device is in the third storage state, so as to program the same to be in a fourth storage state; and applying the first negative pulse voltage to the resistance type memory device when the resistance type memory device is in the fourth storage state, so as to program the same to be in the first storage state, wherein the second positive pulse voltage is less than the third positive pulse voltage, and the third positive pulse voltage is less than the fourth positive pulse voltage.

20. The method of operating a resistance type memory device according to claim 19, a resistivity of the resistance type memory device in the initial state being a tenth resistivity, the resistivity of the resistance type memory device in the first storage state being an eleventh resistivity, the resistivity of the resistance type memory device in the second storage state being a twelfth resistivity, the resistivity of the resistance type memory device in the third storage state being a thirteenth resistivity, the resistivity of the resistance type memory device in the fourth storage state being a fourteenth resistivity, wherein the eleventh resistivity is less than the twelfth resistivity,
the twelfth resistivity is less than the thirteenth resistivity,
the thirteenth resistivity is less than the fourteenth resistivity, and
the tenth resistivity is between the twelfth and the thirteenth resistivities.

21. The method of operating a resistance type memory device according to claim 20, wherein the eleventh resistivity is less than 0.09 ohms-cm, the twelfth resistivity ranges from 0.09 ohms-cm to 0.15 ohms-cm, the thirteenth resistivity ranges from 0.15 ohms-cm to 0.25 ohms-cm, and the fourteenth resistivity is greater than 0.25 ohms-cm.

22. The method of operating a resistance type memory device according to claim 19, wherein the third positive pulse voltage is applied to the resistance type memory device when the resistance type memory device is in the first storage state, so as to program the same to be in the third storage state.

23. The method of operating a resistance type memory device according to claim 19, wherein the fourth positive pulse voltage is applied to the resistance type memory device when the resistance type memory device is in the first storage state, so as to program the same to be in the fourth storage state.

24. The method of operating a resistance type memory device according to claim 19, wherein the fourth positive pulse voltage is applied to the resistance type memory device when the resistance type memory device is in the second storage state, so as to program the same to be in the fourth storage state.

25. The method of operating a resistance type memory device according to claim 19, wherein a fifth negative pulse voltage is applied to the resistance type memory device when the resistance type memory device is in the fourth storage state, so as to program the same to be in the second storage state, a sixth negative pulse voltage being applied to the resistance type memory device when the resistance type memory device is in the fourth storage state, so as to program the same to be in the third storage state, wherein an absolute value of the first negative pulse voltage is greater than that of the fifth negative pulse voltage, and the absolute value of the fifth negative pulse voltage is greater than that of the sixth negative pulse voltage.

26. The method of operating a resistance type memory device according to claim 19, wherein a seventh negative pulse voltage is applied to the resistance type memory device when the resistance type memory device is in the third storage state, so as to program the same to be in the first storage state, an eighth negative pulse voltage being applied to the resistance type memory device when the resistance type memory device is in the third storage state, so as to program the same to be in the second storage state, wherein an absolute value of the seventh negative pulse voltage is greater than that of the eighth negative pulse voltage.

27. The method of operating a resistance type memory device according to claim 19, wherein a ninth negative pulse voltage is applied to the resistance type memory device when the resistance type memory device is in the second storage state, so as to program the same to be in the first storage state.

* * * * *